United States Patent
Chebib

(10) Patent No.: US 10,171,208 B2
(45) Date of Patent: Jan. 1, 2019

(54) DYNAMIC ERROR CORRECTION PROCEDURES

(71) Applicant: Verizon Patent and Licensing Inc., Arlington, VA (US)

(72) Inventor: Nader El Chebib, Louisville, KY (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 217 days.

(21) Appl. No.: 15/157,175

(22) Filed: May 17, 2016

(65) Prior Publication Data

US 2017/0338908 A1 Nov. 23, 2017

(51) Int. Cl.
*H04L 1/18* (2006.01)
*H04W 72/04* (2009.01)
*H03M 13/00* (2006.01)
*H04W 24/02* (2009.01)

(52) U.S. Cl.
CPC .............. *H04L 1/18* (2013.01); *H04L 1/1812* (2013.01); *H04L 1/1822* (2013.01); *H04L 1/1825* (2013.01); *H03M 13/6306* (2013.01); *H04L 1/1893* (2013.01); *H04W 24/02* (2013.01); *H04W 72/0493* (2013.01)

(58) Field of Classification Search
CPC . H04L 1/08; H04L 1/18; H04L 1/1812; H04L 1/1822; H04L 1/1825; H03M 13/6306; H04W 72/0493; H04W 24/02
USPC ......................................... 714/746, 748, 752
See application file for complete search history.

(56) References Cited

U.S. PATENT DOCUMENTS

| | | | | |
|---|---|---|---|---|
| 2009/0313519 | A1* | 12/2009 | Nagaraja ............... | H04L 1/0042 714/751 |
| 2010/0017672 | A1* | 1/2010 | Suga .................... | H04B 7/2606 714/748 |
| 2010/0118719 | A1* | 5/2010 | Ishii ...................... | H04L 1/0003 370/252 |
| 2010/0232618 | A1* | 9/2010 | Haartsen ............... | H04L 1/0003 381/80 |
| 2011/0164507 | A1* | 7/2011 | Jeon ...................... | H04L 1/1812 370/242 |
| 2012/0079329 | A1* | 3/2012 | Steinbach ............ | H04N 19/176 714/704 |
| 2013/0028189 | A1* | 1/2013 | Bourlas ................. | H04L 1/1848 370/328 |
| 2013/0170407 | A1* | 7/2013 | Liang .................... | H04L 1/1607 370/280 |

(Continued)

*Primary Examiner* — Albert Decady
*Assistant Examiner* — Osman M Alshack

(57) ABSTRACT

Techniques described herein may be used to enable a base station to dynamically implement error correction procedures (e.g., Hybrid Automatic Repeat Request (HARQ), Forward Error Correction (FEC), etc.) based on one or more factors, such as a level of network activity, network congestion, etc. When network congestion is high, the network device may implement an error correction policy that is directed to using available network resources to prioritize error correction procedures for transmission failures with high service requirements. However, when network congestion is low, the network device may implement an error correction policy directed to optimizing error correction effectiveness by allocating unused network resources (e.g., bandwidth, physical channels, etc.) to correct transmission failures.

20 Claims, 7 Drawing Sheets

(56) References Cited

U.S. PATENT DOCUMENTS

| | | | |
|---|---|---|---|
| 2013/0294372 A1* | 11/2013 | Ishii | H04W 72/0406 370/329 |
| 2013/0343278 A1* | 12/2013 | Chandra | H04L 1/1838 370/328 |
| 2014/0187251 A1* | 7/2014 | Viswanathan | H04W 72/082 455/450 |

* cited by examiner

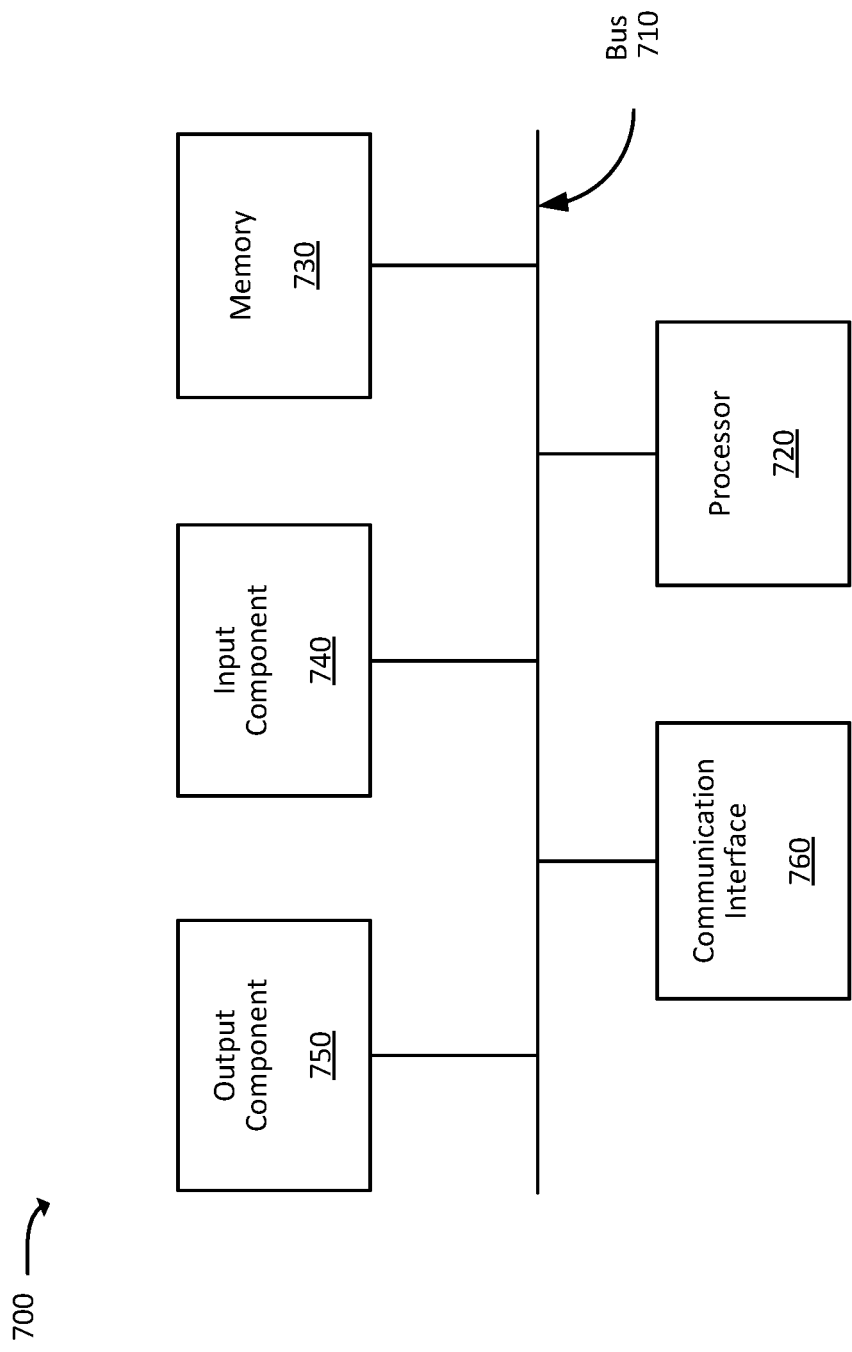

DYNAMIC ERROR CORRECTION PROCEDURES

BACKGROUND

Wireless telecommunication networks, and other types of networks, may implement error correction techniques to better ensure that information transmitted from one device (such as a base station) to another device (such as a smartphone) is successfully received. For example, a Radio Access Network (RAN), such as a Long-Term Evolution (LTE) network, a WiFi network, etc., may implement error correction procedures, such as Hybrid Automatic Repeat Request (HARQ) procedures, Forward Error Correction (FEC) procedures, channel coding procedures, etc., to ensure that transmissions within the RAN are successful. Examples of such error correction procedures may be implemented at the Media Access Control (MAC) layer.

As a particular example of an error correction technique, when a base station transmits information to a UE, the UE may check for errors at the MAC layer. If the Block Error Rate (BLER) for the transmission is higher than a given threshold (e.g., more than 10% of the information transmitted), the UE may notify the base station that the information was not successfully received, and the base station may automatically retransmit the information to the UE. In response, the UE may check the retransmission for errors, and if the BLER for the retransmission is too high (i.e., above the threshold), the UE may again request that the network device retransmit the information. The network device and UE may continue in this manner (e.g., by checking for errors and retransmitting the information) until, for example, the UE receives the information successfully (i.e., without too many errors).

BRIEF DESCRIPTION OF THE DRAWINGS

Embodiments of the present disclosure will be readily understood by the following detailed description in conjunction with the accompanying drawings. To facilitate this description, like reference numerals may designate like structural elements. Embodiments of the disclosure are illustrated by way of example and not by way of limitation in the figures of the accompanying drawings.

FIG. 7 is a diagram of example components of a device.

DETAILED DESCRIPTION OF PREFERRED EMBODIMENTS

Figure 1:
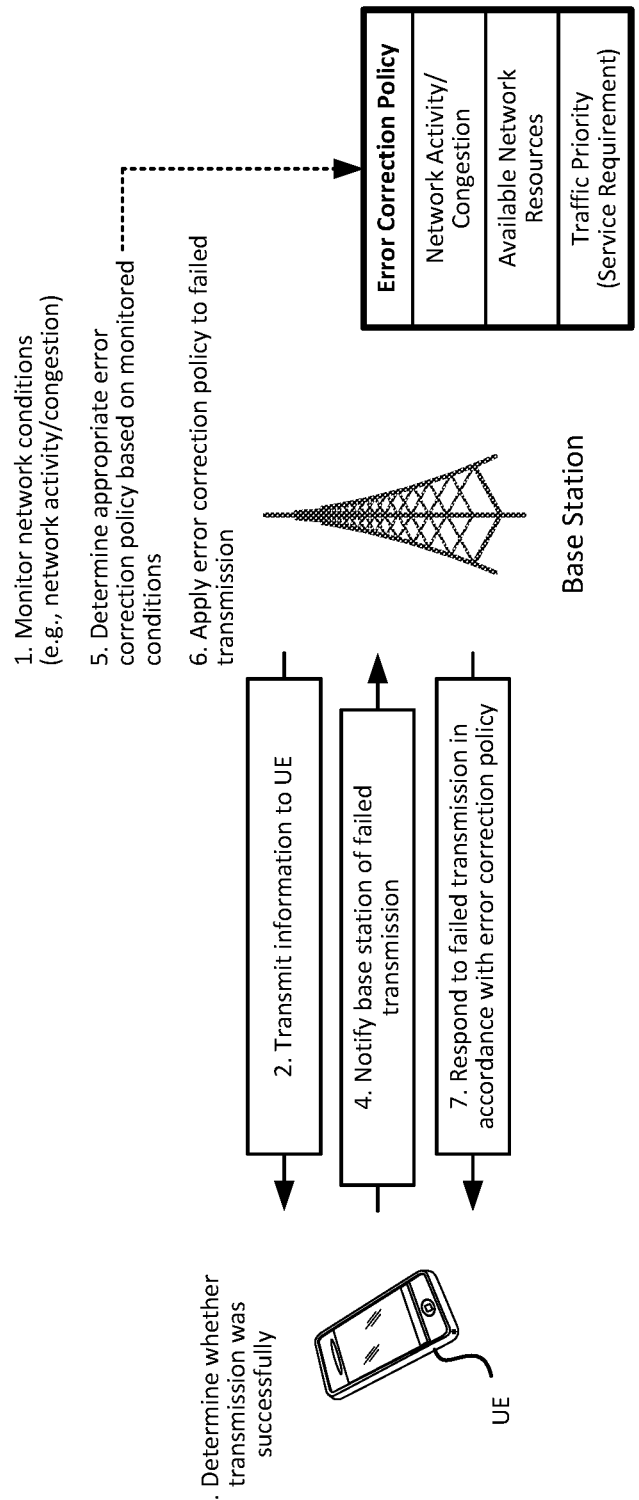
FIG. 1 illustrates an example overview of an implementation described herein.

The following detailed description refers to the accompanying drawings. The same reference numbers in different drawings may identify the same or similar elements. It is to be understood that other embodiments may be utilized and structural or logical changes may be made without departing from the scope of the present disclosure. Therefore, the following detailed description is not to be taken in a limiting sense, and the scope of embodiments in accordance with the appended claims and their equivalents.

Wireless telecommunication networks, and other types of networks, may implement error correction techniques to better ensure that information transmitted from one device (such as a base station) is successfully received by another device (such as a user equipment (UE)). Some examples of error correction techniques may include Hybrid Automatic Repeat Request (HARQ) procedures, Forward Error Correction (FEC) procedures, channel coding procedures, etc.). While error correction procedures may correct inadequate transmissions, such procedures may also exacerbate certain problems, such as network congestion, signal interference, and/or other network performance issues.

For example, even when the current level of congestion in the network is already high, error correction procedures may include a series of retransmissions between a UE and a base station, and may thus further increase a level of congestion within a network. When congestions and signal interference within a network is high, retransmission that further increase congestion, signal interference, etc., may, in turn, increase the frequency of failed transmission and, consequently, the frequency of error correction procedures, which may result in an unwanted feedback loop of decreasing network performance.

Additionally, currently available error correction techniques may be implemented irrespective of what types of information are involved. For instance, even when network resources (e.g., bandwidth, physical resource block (PRBs), channels, etc.) are limited, a network may still implement error correction procedures on a first-come, first-serve basis (without regard to the service requirements (e.g., the Quality of Service (QoS)) associated with failed transmissions. As such, situations may arise where the network performs an error correction procedure for lower-priority sessions (e.g., a data backup procedure, a data dump procedure, etc.) in lieu of a higher-priority sessions (e.g., a time-sensitive transmission corresponding to a voice call, a video call, or another type of media session). The indiscriminant implementation of the error correction procedures may erroneously prioritize certain transmissions over other transmissions (e.g., by prioritizing less time-sensitive transmissions over transmissions that are more time-sensitive).

Techniques described herein may be used to enable a network device (e.g., a base station) to dynamically implement error correction procedures (e.g., HARQ, FEC, etc.) based on one or more factors, such as a level of network activity or congestion, the availability of network resources to correct failed transmissions, and the relative service requirements of failed transmissions. When network congestion is high, the network device may implement an error correction policy that is directed to, for example, the efficient use of the limited network resources that are still available (e.g., by using available network resources to correct transmission failures with the highest quality of service (QoS) requirements). However, when network congestion is low, the network device may implement an error correction policy directed to, for example, optimizing the effectiveness of rate of error correction procedures (e.g., by allocating unused network resources to retransmit information more rapidly, more frequently, with greater signal strength, etc.). Allocating greater strength could be implemented by muting part of the bandwidth to maximize transmission power on the allocated resources.

FIG. 1 illustrates an example overview of an implementation described herein. As shown, a base station (or another type of network device) may monitor network conditions (at 1). Examples of such conditions may include network utilization (e.g., a number of UEs connected to the base station, a number of connections between the UEs and the base station, bandwidth utilization, Physical Resource Block (PRB) utilization, channel usage, or the like), signal interference, and/or other network conditions. At some point, the base station may transmit information to a UE connected to the base station (at 2). The UE may determine a whether the information is received successfully. For instance, the UE may determine whether a Block Error Rate (BLER) (a percentage of blocks not received by the UE, relative to a number of blocks transmitted by the base station) exceeds a particular threshold (e.g., 10%) (at 3). If the BLER is below the error threshold, the UE may conclude that the UE successfully received the transmission from the base station.

However, if the BLER exceeds the error threshold, the UE may notify the base station that the transmission has failed (at 4), such as by notifying the base station that the BLER has exceeded the error threshold. The base station may determine an appropriate error correction policy based on the monitored network conditions and/or one or more other factors associated with the transmission (at 5). For example, if network congestion is relatively high (i.e., above a particular threshold), the error correction policy may include identifying available network resources (e.g., available bandwidth, unused channels, etc.), identifying a service requirement or priority (e.g., a QoS) associated with the failed transmission, and retransmitting the information based on the available network resources and the service requirements of the failed transmission.

For instance, if the available network resources are relatively limited and the service priority of the failed transmission is low (relative to the service priority of other transmissions), the base station may postpone the retransmission of the information so that the transmission of more important information (e.g., information with a greater QoS) may be performed instead. By contrast, if the available network resources are very limited but the service priority of the failed transmission is high (relative to the service priority of other failed transmissions), the base station may promptly implement an error correction procedure (e.g., by promptly retransmitting the original information).

By contrast, still assuming that the failed transmission is of a relatively low service priority, if the network congestion is relatively low (i.e., below a particular threshold), the error correction policy may include identifying unused resources (e.g., bandwidth, physical channels, etc.) and reallocating the unused resources to increase the rate at which information is retransmitted, increasing the bandwidth allocated to transmitting information, increasing the maximum duration or number of times that the base station may retransmit the information, allocating more transmission power to retransmitted resources, etc. For example, more bandwidth could be allocated for future transmissions (with less efficient modulating coding scheme (e.g., with less information bits per transmitted payload)) for better protection against perceived errors even if the instantaneous RF measurements could result in the allocation of a more efficient error coding scheme (more information bits present in transmitted payload). In some implementations, the error correction policy may also include identifying the service requirements of the failed transmission and allocating unused resources to the retransmission of information in accordance with the service requirements of the failed transmission.

Figure 2:
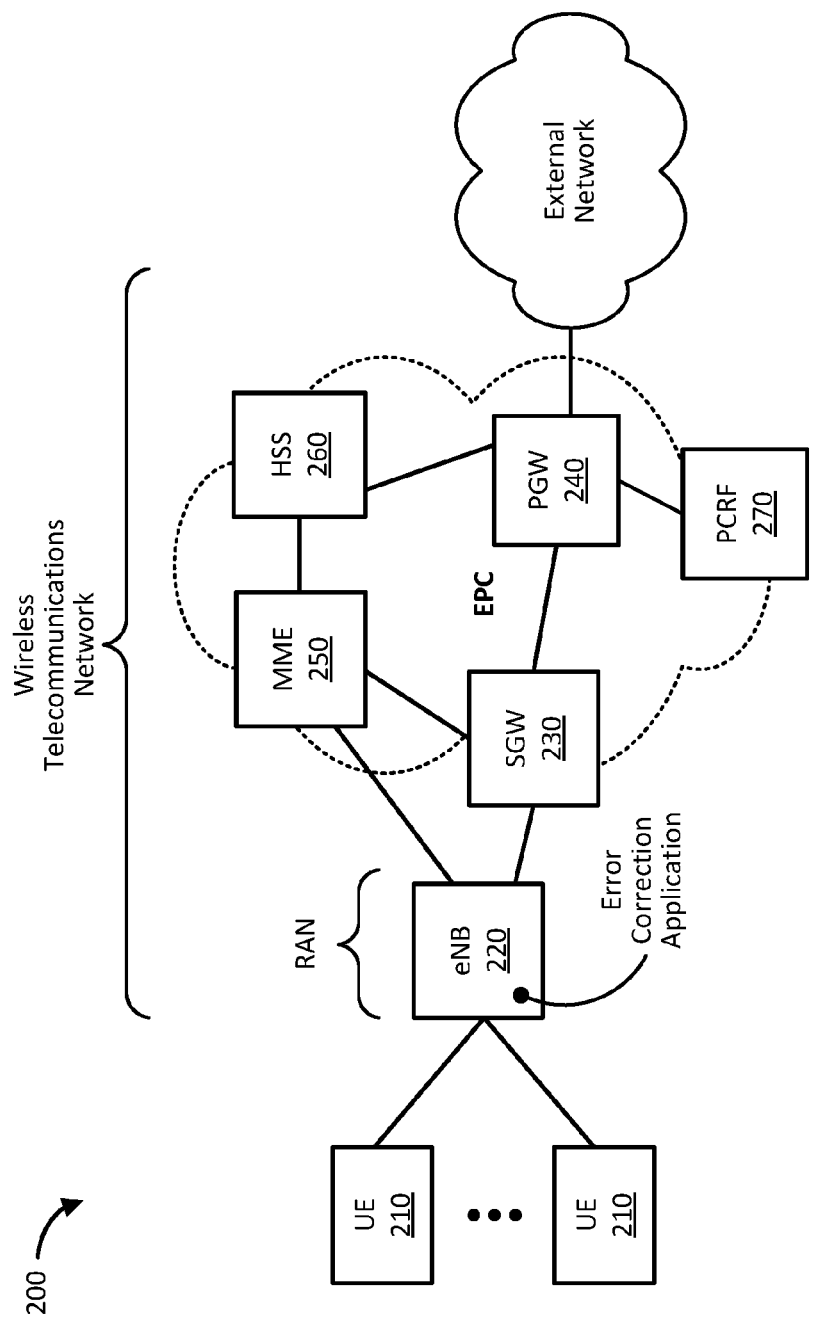
FIG. 2 illustrates an example environment in which systems and/or methods described herein may be implemented.

FIG. 2 illustrates an example environment 200 in which systems and/or methods described herein may be implemented. Environment 200 may include UEs 210, a wireless telecommunications network, and an external network. The wireless telecommunications network may include an Evolved Packet System (EPS) that includes a Long-Term Evolution (LTE) network and/or an evolved packet core (EPC) network that operates based on a 3rd Generation Partnership Project (3GPP) wireless communication standard. The LTE network may be, or may include, radio access networks (RANs) that include one or more base stations, some or all of which may take the form of enhanced Node Bs (eNBs) 220, via which UEs 210 may communicate with the EPC network.

The EPC network may include Serving Gateway (SGW) 230, PDN Gateway (PGW) 240, Mobility Management Entity (MME) 250, Home Subscriber Server (HSS) 260, and/or Policy and Charging Rules Function (PCRF) 270. As shown, the EPC network may enable UEs 210 to communicate with an external network, such as a Public Land Mobile Networks (PLMN), a Public Switched Telephone Network (PSTN), and/or an Internet Protocol (IP) network (e.g., the Internet).

UE 210 may include a portable computing and communication device, such as a personal digital assistant (PDA), a smart phone, a cellular phone, a laptop computer with connectivity to the wireless telecommunications network, a tablet computer, etc. UE 210 may also include a non-portable computing device, such as a desktop computer, a consumer or business appliance, or another device that has the ability to connect to a RAN of the wireless telecommunications network. UE 210 may also include a computing and communication device that may be worn by a user (also referred to as a wearable device) such as a watch, a fitness band, a necklace, glasses, an eyeglass, a ring, a belt, a headset, or another type of wearable device. UE 210 may be capable of downloading, installing, and/or executing software (e.g., apps), which may be available from a server (or another type of network device) operating as a virtual store, an application library or repository, or another type of service from which UE 210 may obtain the software.

eNB 220 may include one or more network devices that receives, processes, and/or transmits traffic destined for and/or received from UE 210 (e.g., via an air interface). eNB 220 may be connected to a network device, such as site router, that functions as an intermediary for information communicated between eNB 220 and the EPC. As shown, eNB 220 may include an error correction application that enables eNB 220 to perform one or more of the techniques described herein. For example, the error correction application may enable eNB 220 to monitor network conditions (such as network activity, network congestion, PRB utilization, etc.) and implement an error correction policy based on the network conditions. The error correction policy may provide instructions for implementing error correction procedures (e.g., retransmitting information) based on factors, such as network resource availability and service requirements associated with failed transmissions. Detailed examples of such polices are provided below with reference to, for example, FIG. 5.

SGW 230 may aggregate traffic received from one or more eNBs 220 and may send the aggregated traffic to an external network or device via PGW 240. Additionally, SGW 230 may aggregate traffic received from one or more PGWs 240 and may send the aggregated traffic to one or more eNBs 220. SGW 230 may operate as an anchor for the user plane during inter-eNB handovers and as an anchor for mobility between different telecommunication networks. PGW 240 may include one or more network devices that may aggregate traffic received from one or more SGWs 230, and may send the aggregated traffic to an external network. PGW 240 may also, or alternatively, receive traffic from the external network and may send the traffic toward UE 210 (via SGW 230 and/or eNB 220).

MME 250 may include one or more computation and communication devices that act as a control node for eNB 220 and/or other devices that provide the air interface for the wireless telecommunications network. For example, MME 250 may perform operations to register UE 210 with the wireless telecommunications network, to establish bearer channels (e.g., traffic flows) associated with a session with UE 210, to hand off UE 210 to a different eNB, MME, or another network, and/or to perform other operations. MME 250 may perform policing operations on traffic destined for and/or received from UE 210.

HSS 260 may include one or more devices that may manage, update, and/or store, in a memory associated with HSS 260, profile information associated with a subscriber (e.g., a subscriber associated with UE 210). The profile information may identify applications and/or services that are permitted for and/or accessible by the subscriber; a Mobile Directory Number (MDN) associated with the subscriber; bandwidth or data rate thresholds associated with the applications and/or services; and/or other information. The subscriber may be associated with UE 210. Additionally, or alternatively, HSS 260 may perform authentication, authorization, and/or accounting operations associated with the subscriber and/or a communication session with UE 210.

PCRF 270 may receive information regarding policies and/or subscriptions from one or more sources, such as subscriber databases and/or from one or more users. PCRF 270 may provide these policies to PGW 240 or another device so that the policies can be enforced. As depicted, in some implementations, PCRF 270 may communicate with PGW 240 to ensure that charging policies are properly applied to locally routed sessions within the telecommunications network. For instance, after a locally routed session is terminated, PGW 240 may collect charging information regarding the session and provide the charging information to PCRF 270 for enforcement.

The quantity of devices and/or networks, illustrated in FIG. 2, is provided for explanatory purposes only. In practice, environment 200 may include additional devices and/or networks; fewer devices and/or networks; different devices and/or networks; or differently arranged devices and/or networks than illustrated in FIG. 2. For example, while not shown, environment 200 may include devices that facilitate or enable communication between various components shown in environment 200, such as routers, modems, gateways, switches, hubs, etc. Alternatively, or additionally, one or more of the devices of environment 200 may perform one or more functions described as being performed by another one or more of the devices of environment 200. Additionally, the devices of environment 200 may interconnect with each other and/or other devices via wired connections, wireless connections, or a combination of wired and wireless connections. In some implementations, one or more devices of environment 200 may be physically integrated in, and/or may be physically attached to, one or more other devices of environment 200. Also, while "direct" connections may be shown between certain devices in FIG. 2, some of said devices may, in practice, communicate with each other via one or more additional devices and/or networks.

Figure 3:
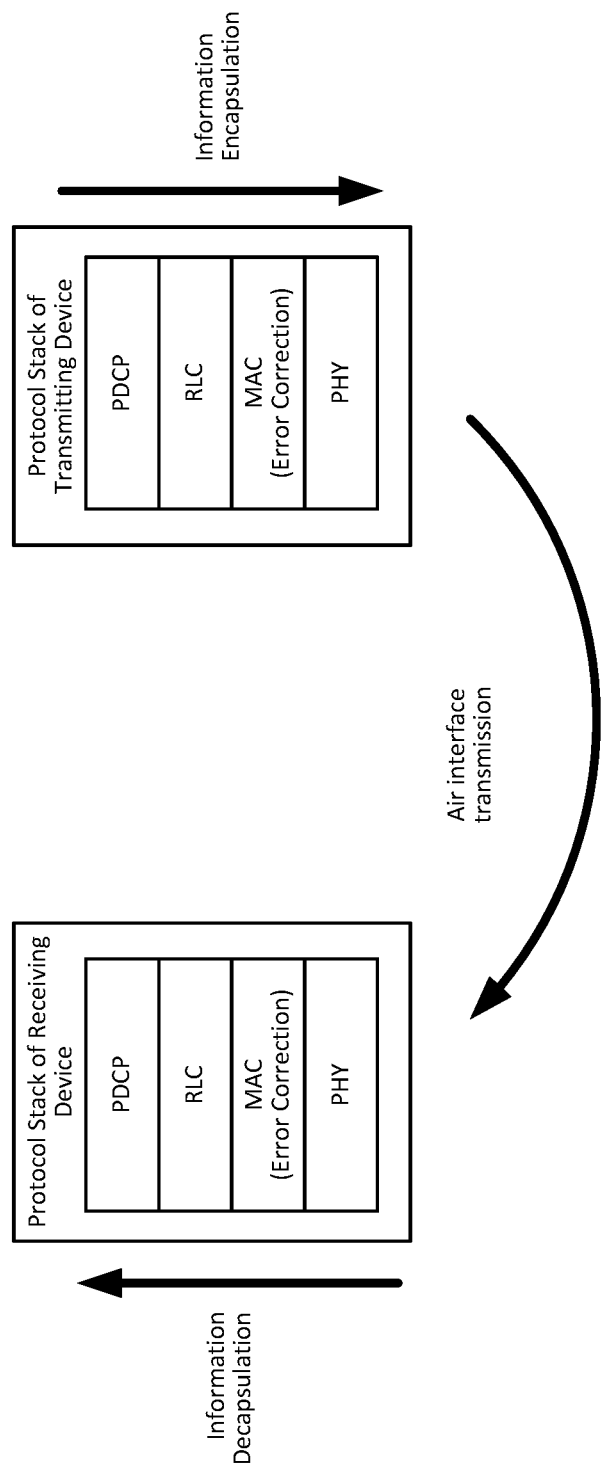
FIG. 3 illustrates example protocol stacks for a transmitting device and a receiving device.

FIG. 3 illustrates example protocol stacks for a transmitting device and a receiving device. As shown, each protocol stack may include a Packet Data Convergence Protocol (PDCP) layer, a Radio Link Control (RLC) layer, a MAC layer, and a physical (PHY) layer. In some implementations, the protocol stacks of the transmitting device may correspond to eNB 220 and the protocol stack of the receiving device may correspond to UE 210. In some implementations, the protocol stacks of the transmitting device and/or the protocol stack of the receiving device may include additional layers, fewer layers, and/or different layers than those presented in FIG. 3.

As shown, prior to transmitting information to the receiving device (e.g., UE 210), the transmitting device (e.g., eNB 220) may encapsulate the information in accordance with the successive layers shown in the stack. For instance, the information may first be encapsulated at the PDCP layer, then the RLC layer, followed by the MAC layer and the PHY layer. At each layer, a new header and/or trailer may be aggregated to the information that is being encapsulated. At the PHY layer, the transmitting device may send the information (e.g., via an LTE air interface) to the receiving device. The receiving device may receive the encapsulated information at the PHY layer and my successively decapsulate the information in the manner depicted in FIG. 3.

As shown, the error correction procedures (as discussed herein) may be performed at a particular layer (e.g., the MAC layer) of each protocol stack. The error correction procedure may be initiated by the receiving device determining that information transmitted from the transmitting device included too many errors (e.g., a BLER above a particular threshold) and notifying the transmitting device that the information was not successfully received. In response, the transmitting device may retransmit the information so that the receiving device has another chance to receive the information. As mentioned above, examples of an error correction procedure may include a HARQ procedure, a FEC procedure, a channel coding procedure, or another type of error correction procedure.

Techniques described herein may enable the transmitting device (e.g., eNB 220) to dynamically implement an error correction policy that in germane (or based on) one or more factors, such as a level of network activity, congestion, channel utilization, PRB utilization, etc. In turn, the error correction policy may implement error correction procedures base on one or more conditions/factors, such as the availability of network resources, the relative importance (e.g., time-sensitivity) of each failed transmission, etc. In this manner, the techniques described herein may enable the error correction procedures to be dynamically implemented (i.e., based on current network conditions, service requirements of a particular transmission, etc.).

Figure 4:
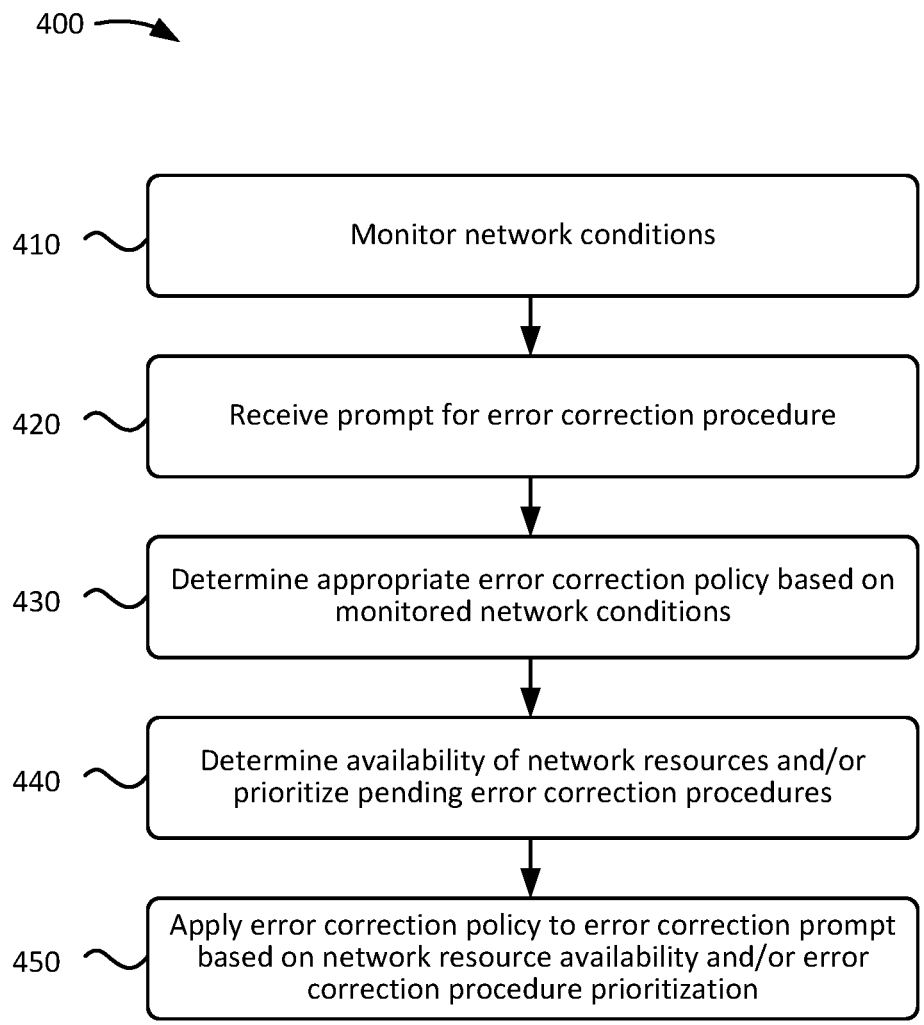
FIG. 4 illustrates an example process for dynamically implementing error correction procedures.

FIG. 4 illustrates an example process for dynamically implementing error correction procedures. In some implementations, process 400 may be implemented by eNB 220 (e.g., by the error correction application depicted in FIG. 2).

As shown, process 400 may include monitoring network conditions (block 410). For example, eNB 220 may collect information regarding one or more network conditions. Examples of network conditions may include a number of UEs connected to eNB 220, a number of connections between UEs 210 and eNB 220, and a level of signal interference within a RAN of eNB 220. Additional examples of network conditions may include bandwidth utilization (e.g., an amount of bandwidth being used by eNB 220), PRB utilization (e.g., an amount of PRBs being used by eNB 220), an amount of downlink buffer memory being used by eNB 220, and/or other suitable metrics that indicate network conditions and/or utilization. As such, depending on the implementations, eNB 220 may monitor a wide variety of network conditions.

Process 400 may include receiving a prompt for an error correction procedure (block 420). For example, eNB 220 may receive a notification from UE 210 that a particular transmission, from eNB 220 to UE 210, has failed. As mentioned above, such a notification may be received if/when UE 210 receives a transmission, from eNB 220, with a BLER that exceeds a particular error threshold. In some implementations, the error threshold may be a percentage (e.g., 10%, 20%, etc.) of the information that should have been received by UE 210. For example, if more than 10% of a particular transmission form eNB 220 is not received by UE 210, UE 210 may conclude that the transmission has failed and may notify eNB 220 of the failure. In some implementations, UE 210 may notify eNB 220 of the raw percentage (or other representation) of the BLER when the BLER has exceeded a threshold. In other implementations, UE 210 may periodically or intermittently notify eNB 220 of the BLER or a value that is calculated based on the BLER (e.g., an average BLER, a median BLER, a maximum BLER, a minimum BLER, etc.) of transmissions that have been received over a given timeframe (e.g., a rolling timeframe window, such as every minute, every five minutes, etc.). In such situations, eNB 220 (or some other device) may determine whether the BLER (or the value that is calculated based on the BLER, such as the average, the median, etc.), of transmissions to UE 210, have exceeded the threshold BLER.

Process 400 may include determining an appropriate error correction policy based on the monitored network conditions (block 430). For example, eNB 220 may determine what type of error correction policy is appropriate based on whether network conditions have exceeded a corresponding threshold. For instance, if eNB 220 is monitoring the number of UEs 210 that are connected to eNB 220, and the number of UEs 210 connected to eNB 220 exceeds a pre-selected threshold of UEs 210, eNB 220 may conclude that, for example, the level of network activity and/or congestion in the RAN is too high for error correction policies that are directed to, for example, scenarios in which unused network resources are abundant.

As a result, since network resources may be limited when network activity/congestion is high, eNB 220 may implement an error correction policy that is designed to prioritize error correction procedures that correspond to transmissions that require a relatively high level of network performance (e.g., voice calls, video calls, streaming video, etc.). These requirements may be indicated by QoS levels associated with the transmissions (e.g., QoS class index (QCI), in LTE implementations). By contrast, if/when the network activity is below the corresponding threshold, eNB 220 may conclude that network activity/congestion is relatively low. As a result, eNB 220 may implement an error correction policy that optimizes error correction effectiveness by, for example, allocating additional network resources (e.g., bandwidth, physical channels, etc.) to performing error correction procedures faster (e.g., retransmission of failed transmissions), more often, etc.

Process 400 may include determining the availability of network resources and/or prioritizing pending error correction procedures (block 440). For example, eNB 220 may determine the network resources (e.g., bandwidth, physical channels, etc.) that are available for implementing error correction procedures. These network resources may, in some implementations, be separate from network resources that are allocated to "ordinary" transmissions (e.g., initial transmissions, as opposed to retransmission of failed transmissions). Additionally, eNB 220 may determine the level of service (e.g., the QoS) that corresponds to the failed transmissions for which error correction procedures are required. eNB 220 may also prioritize the failed transmissions for which error correction procedure are required based on the level of service corresponding to each failed transmission. As an example, eNB 220 may determine that an error correction procedure for a failing telephone call should be given greater priority than an error correction procedure for a software update operation.

Process 400 may include applying an error correction policy to the error correction prompt based on network resource availability and/or error correction procedure prioritization (block 450). For example, depending on the type of error correction policy that is deemed appropriate, eNB 220 may respond to the error correction prompt in different ways. For instance, if network activity/congestion is relatively high, eNB 220 may respond to the prompt based on the network resource availability and the relative importance (e.g., QoS) of the failed transmission to which the prompt corresponds. Alternatively, if network activity/congestion is relatively low, eNB 220 may respond to the error correction prompt by allocating additional bandwidth, channels, or other network resources to better ensure that the information corresponding to the failed transmission is retransmitted as soon as possible (e.g., regardless of the QoS associated with the failed transmission).

In some implementations, the significance that QoS (or another type of priority indicator) may have on performing error correction procedures may be weighted based on network activity (and/or congestion). For example, when network activity is high, the QoS associated with a transmission (and/or retransmission) may be of greater significance than when network activity is low. In some implementations, the significance that QoS has may be applied proportionately to any level of network activity between high levels of network activity and low levels of network activity.

Figure 5:
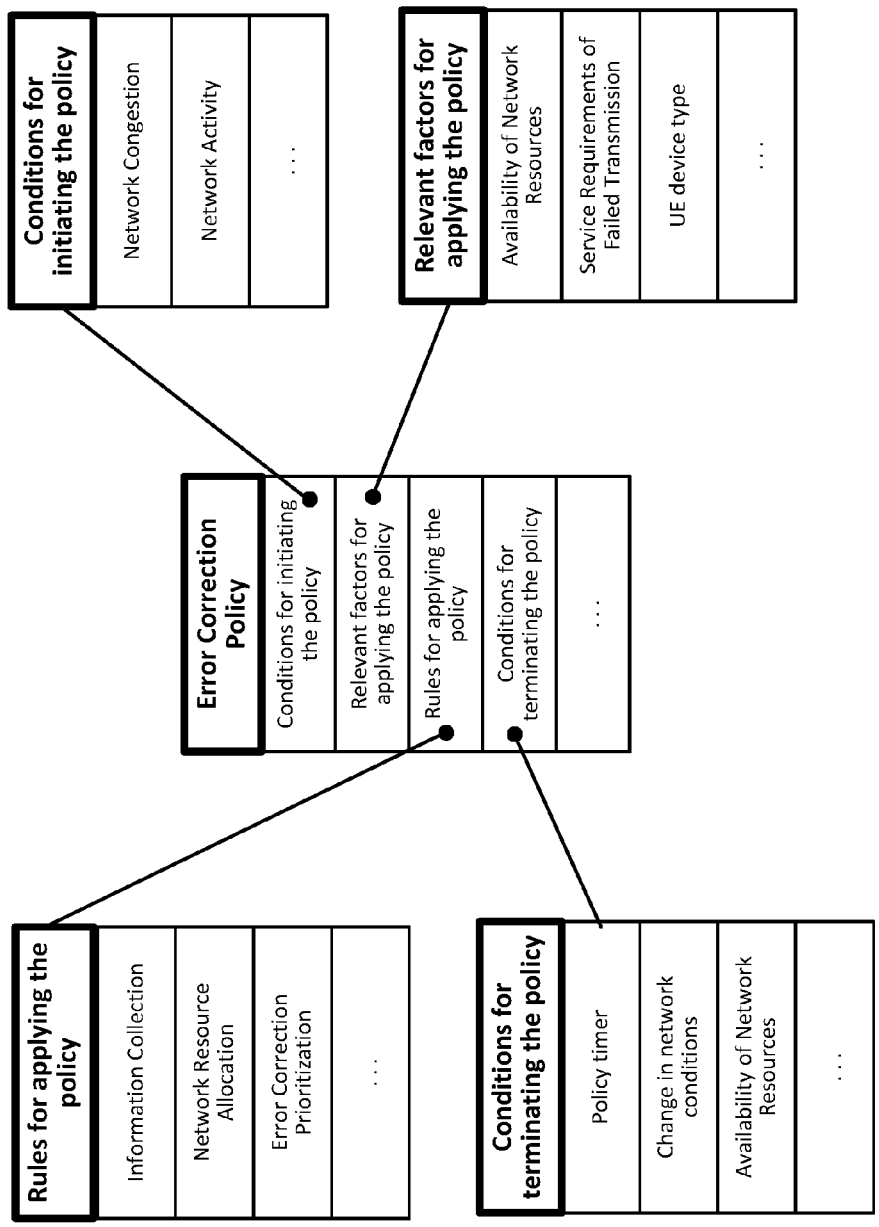
FIG. 5 illustrates a block diagram of an example of an error correction policy.

FIG. 5 illustrates a block diagram of an example of an error correction policy. As shown, the error correction policy may include one or more logical components, such as conditions for initiating the policy, relevant factors for applying the policy, rules for applying the policy, and conditions for terminating the policy. In some implementations, the error correction policy depicted in FIG. 5 may include additional logical components, fewer logical components, and/or different logical components than those presented in FIG. 5.

As shown, an error correction policy may include conditions for initiating the policy, which may relate to network congestion (e.g., a level of network congestion in a RAN of eNB 220) and/or network activity (e.g., a level of network activity in a RAN of eNB 220). Examples of network congestion and/or network activity may include one or more types of information, such as a number of UEs 210 connected to eNB 220 and/or a number of connections between UEs 210 and eNB 220. Additional, or alternative, examples of network congestion and/or network activity may include PRB utilization (e.g., a number of PRBs that are currently in use), channel utilization (e.g., a number of physical channels being used by UEs 210 connected to eNB 210), or one or more other types of information that are descriptive of the state of eNB 210 and/or a RAN to which eNB 220 corresponds.

An error correction policy may also include factors that are relevant for applying the policy. Examples of such factors may include an availability of network resources, service requirements of failed transmissions, UE device types, etc. The availability of network resources may include a number or a percentage of PRBs that not being utilized, a number or a percentage of physical channels that are not being utilized, an amount or a percentage of bandwidth that is not being used, etc. The service requirements of a failed transmission may include a priority, an amount of throughput, a level of service (e.g., a QoS), etc., that may be associated with a failed transmission.

In some eNB 220 may determine the service requirements of a failed transmission by identifying a QoS Class Identifier (QCI) (and/or another type of service indicator) corresponding to the failed transmission. The service requirements of a failed transmission may include a traffic priority representing that the failed transmission corresponds to a time-sensitive service such as a media session (e.g., a voice call, a video call, a content streaming service, etc.). In some implementations, the traffic priority may also, or alternatively, represent a level of importance or time-sensitivity of the failed transmission. The relevant factors for applying the policy may also include UE device type information. Such information may indicate whether a particular UE 210 is a user device (e.g., a smartphone, a tablet computer, etc.), an Internet of Things (IoT) device (which may include a Machine-To-Machine (M2M) device, a Machine-Type-Communication (MTC) device, etc.), or another type of UE.

The error correction policy may also include rules for applying the policy (e.g., to a filed transmission). As shown, such rules may include information collection rules, network resource allocation rules, prioritization rules, and other types of rules. Information collection rules may include instructions for collecting network congestions information, network activity information, network resource availability information, and/or other types of information that may be relevant to applying an error correction policy to a failed transmission. Network resource allocation rules may include instructions for allocating network resources (e.g., PRBs, physical channels, bandwidth, etc.) to error correction procedures. In some implementations, the manner in which available network resources are allocated may depending on conditions, such as a level of network congestion or activity, a number or percentage of available network resources, a number of failed transmission to be corrected (e.g., by retransmission), a service requirement associated with one or more failed transmissions, etc. Error correction prioritization rules may include instructions for ranking service requirements, corresponding to failed transmissions to be corrected, and/or one or more other types of information described herein.

The error correction policy may also include conditions for terminating the policy (e.g., for discontinuing the implementation of a particular policy). Examples of such conditions may include the expiration of a particular timer (e.g., an error correction timer), a change in network conditions, an availability of network resources, etc. For instance, as described below with reference to FIG. 6, eNB 220 may initiate a timer for implementing a particular policy in response to a particular trigger, such as a level of network congestion/activity exceeding a pre-selected threshold. For the duration of the time, eNB 220 may implement a particular error correction policy for failed transmissions. However, when the timer expires, eNB 220 may switch to another error correction policy.

The conditions for terminating the error correction policy may also include a change in one or more network conditions. For instance, as described in more detail below with reference to FIG. 6, under certain network conditions (e.g., a lower level of network activity), eNB 220 may implement one type of error correction policy; however, in response to that network condition changing, eNB 220 may implement another type of error correction policy. In another example, eNB 220 may also, or alternatively, implement a particular error correction policy in response to an amount or percentage of network resources that are available (or not available). For example, while an amount of available bandwidth is below a particular threshold, eNB 220 may implement one type of error correction policy; however, if/when the amount of available bandwidth exceeds the threshold, eNB 220 may implement another type of error correction policy.

Figure 6:
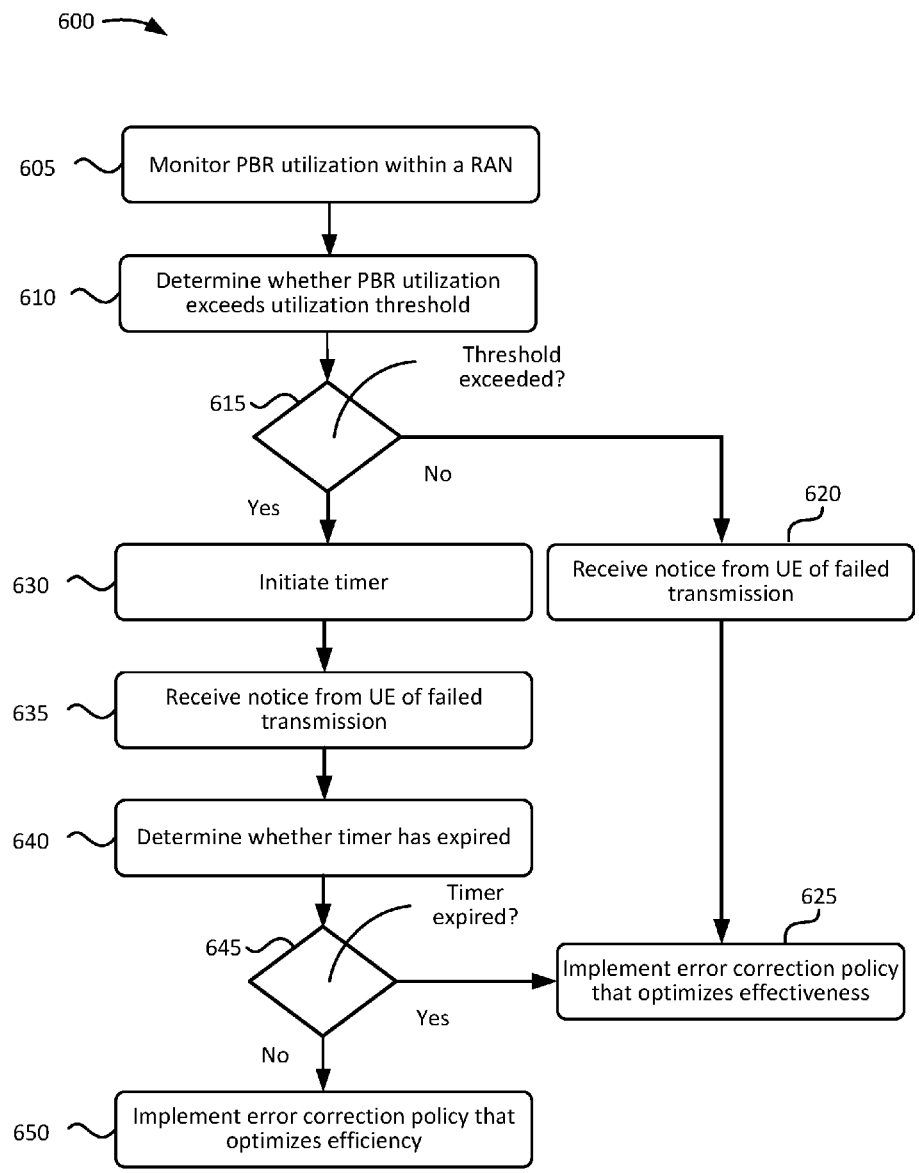
FIG. 6 illustrates another example process for dynamically implementing error correction procedures.

FIG. 6 illustrates another example process 600 for dynamically implementing error correction procedures. In some implementations, process 600 may be implemented by eNB 220 (e.g., by the error correction application depicted in FIG. 2). Process 600 may include a specific example of the process discussed above with reference to FIG. 4.

As shown, process 600 may include monitoring PRB utilization with a RAN (block 605). For example, since eNB 220 may use an LTE air interface to communicate with UE 210, physical resource blocks (PRBs) may be a fundamental unit of frequency allocation for LTE interface. As such, eNB 220 may be capable of accurately determining a level of network activity for the RAN by monitoring PRB utilization. As mentioned above, eNB 220 may monitor other aspects of the RAN (e.g., the number of UEs 210 connected to eNB 220, the amount of bandwidth used by eNB 220, etc.) in order to determine the level of network activity in the RAN.

Process 600 may include determining whether the PRB utilization exceeds a utilization threshold (block 610). For example, eNB 220 may compare the PRM utilization that is monitored by eNB 220 to a utilization threshold. The utilization threshold may include a quantity (e.g., a number of PRBs used), a percentage (e.g., a number of the PRBs being used relative to the total number of PRBs available to eNB 220), or another type of value.

When the PRB utilization does not exceed the utilization threshold (block 615—No), process 600 may continue by receiving a notice from UE 210 of a failed transmission (block 620). For example, while eNB 220 monitors the PRB utilization, eNB 220 may transmit information to UE 210 via the LTE air interface. When UE 210 fails to receive a transmission from eNB 220, UE 210 may initiate an error correction procedure for that transmission by notifying eNB 220 that the transmission was not successful.

Process 600 may include implementing an error correction policy to optimize error correction effectiveness (block 625). For instance, when the PRB utilization is below the utilization threshold, network resources (e.g., bandwidth, physical channels, etc.) may be available for implementing error correction procedures. As such, eNB 220 may implement an error correction policy that enable eNB 220 to implement an error correction procedure that is augmented (e.g., a faster rate of retransmission, a greater bandwidth per transmission, etc.) by allocating the unused network resources to performing the error correction procedure. In this sense, the "effectiveness" of the error correction techniques may be favored, or optimized.

However, when the PBR utilization exceeds the utilization threshold (block 615—Yes), process 600 may include initiating a timer (block 630). For example, eNB 220 may initiate an error correction timer when network activity/congestion is relatively high. As explained below, the timer may provide temporal boundaries (i.e., a period of time) within which a particular error correction policy may be implemented.

For instance, process 600 may include receiving a notice, from UE 210, of a failed transmission (block 635). As mentioned above, while eNB 220 monitors the PRB utilization, eNB 220 may transmit information to UE 210 via the LTE air interface. When UE 210 fails to receive a transmission, UE 210 may initiate an error correction procedure for that transmission by notifying eNB 220 that the transmission was not successful.

Process 600 may include determining whether the timer has expired (block 640). For example, eNB 220 may verify whether the notification of the failed transmission was received before the error correction timer has expired. If so (block 645—Yes), process 600 may implement an error correction policy that optimizes error correction effectiveness. An example of such a policy is provided above.

If, however, the notification from UE 210 is received before the timer has expired (block 645—No), process 600 may include implementing an error correction policy directed toward using network resources efficiently (block 650). For example, if the notification from UE 210 is received before the timer has expired, eNB 220 may assume that network activity/congestion is still relatively high, which means that available network resources may be limited. As such, the error correction policy implemented by eNB 220 may be directed to optimizing the efficiency (e.g., minimizing the quantity or amount of retransmissions) with which network resources are used to perform error correction procedures (e.g., to retransmit failed transmissions). As mentioned above, such a policy may be based on factors such as the network resources that are currently available and a service type or requirement (e.g., a QoS) associated with the failed transmission.

As described above, the example process 600 of FIG. 6 includes implementing an efficiency-based policy (block 650) or an effectiveness-based policy (block 625) depending on a utilization threshold (block 610). In some implementations, an example process may include implementing an efficiency-based policy (block 650) or an effectiveness-based policy (block 625) depending on a weight applied to a QoS corresponding to a failed transmission. For example, as described above with reference to FIG. 4, the significance of QoS may be weighted in accordance with a particular level of network activity (and/or network congestion), such that the significance of QoS may be more important when network activity is high and less important when network activity is low. In such implementations, when the weight applied to the QoS of failed transmissions is above a particular threshold, eNB 220 may implement an effectiveness-based policy for retransmitting the failed transmissions. By contrast, when the weight applied to the QoS of failed transmissions is below the particular threshold, eNB 220 may implement an efficiency-based policy for retransmitting the failed transmissions.

FIG. 7 is a diagram of example components of a device 700. Each of the devices illustrated in FIGS. 1 and 2 may include one or more devices 700. Device 700 may include bus 710, processor 720, memory 730, input component 740, output component 750, and communication interface 760. In another implementation, device 700 may include additional, fewer, different, or differently arranged components. As described herein, a component may be implemented by hardware circuitry, software logic, and/or some combination thereof.

Bus 710 may include one or more communication paths that permit communication among the components of device 700. Processor 720 may include a processor, microprocessor, or processing logic that may interpret and execute instructions. Memory 730 may include any type of dynamic storage device that may store information and instructions for execution by processor 720, and/or any type of non-volatile storage device that may store information for use by processor 720.

Input component 740 may include a mechanism that permits an operator to input information to device 700, such as a keyboard, a keypad, a button, a switch, etc. Output component 750 may include a mechanism that outputs information to the operator, such as a display, a speaker, one or more light emitting diodes (LEDs), etc.

Communication interface 760 may include any transceiver-like mechanism that enables device 700 to communicate with other devices and/or systems. For example, communication interface 760 may include an Ethernet interface, an optical interface, a coaxial interface, or the like. Communication interface 760 may include a wireless communication device, such as an infrared (IR) receiver, a cellular radio, a Bluetooth radio, or the like. The wireless communication device may be coupled to an external device, such as a remote control, a wireless keyboard, a mobile telephone, etc. In some embodiments, device 700 may include more than one communication interface 760. For instance, device 700 may include an optical interface and an Ethernet interface.

Device 700 may perform certain operations described above. Device 700 may perform these operations in response to processor 720 executing software instructions stored in a computer-readable medium, such as memory 730. A computer-readable medium may be defined as a non-transitory memory device. A memory device may include space within a single physical memory device or spread across multiple physical memory devices. The software instructions may be read into memory 730 from another computer-readable medium or from another device. The software instructions stored in memory 730 may cause processor 720 to perform processes described herein. Alternatively, hardwired circuitry may be used in place of or in combination with software instructions to implement processes described herein. Thus, implementations described herein are not limited to any specific combination of hardware circuitry and software.

In the preceding specification, various preferred embodiments have been described with reference to the accompanying drawings. It will, however, be evident that various modifications and changes may be made thereto, and additional embodiments may be implemented, without departing from the broader scope set forth in the claims that follow. The specification and drawings are accordingly to be regarded in an illustrative rather than restrictive sense.

For example, while a series of lines, arrows, and/or blocks have been described with regard to FIGS. 1, 4, and 6 the order of the blocks and arrangement of the lines and/or arrows may be modified in other implementations. Further, non-dependent blocks may be performed in parallel. Similarly, while series of communications have been described with regard to several of the Figures provided herein, the order or nature of the communications may potentially be modified in other implementations.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operations and behaviors of the aspects that were described without reference to the specific software code—it being understood that software and control hardware could be designed to implement the aspects based on the description herein.

Further, certain portions may be implemented as "logic" that performs one or more functions. This logic may include hardware, such as an application-specific integrated circuit (ASIC) or a field-programmable gate array (FPGA), or a combination of hardware and software.

To the extent the aforementioned embodiments collect, store or employ personal information provided by individuals, it should be understood that such information shall be used in accordance with all applicable laws concerning protection" of personal information. Additionally, the collection, storage and use of such information may be subject to consent of the individual to such activity, for example, through well-known "opt-in" or "opt-out" processes as may be appropriate for the situation and type of information. Storage and use of personal information may be in an appropriately secure manner reflective of the type of information, for example, through various encryption and anonymization techniques for particularly sensitive information.

Even though particular combinations of features are recited in the claims and/or disclosed in the specification, these combinations are not intended to be limiting. In fact, many of these features may be combined in ways not specifically recited in the claims and/or disclosed in the specification.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is intended to mean "based, at least in part, on" unless explicitly stated otherwise.

What is claimed is:

1. A base station, comprising:
 a non-transitory computer-readable medium storing a set of processor-executable instructions; and
 one or more processors configured to execute the set of processor-executable instructions, wherein executing the set of processor-executable instructions causes the one or more processors to:
  monitor network conditions corresponding to a Radio Access Network (RAN), of a wireless telecommunications network, to which the base station corresponds, wherein the monitored network conditions include at least one of:
   a quantity of user equipment (UEs) connected to the base station, or
   a quantity of connections between the UEs and the base station;
  transmit information to a particular UE connected to the base station;
  receive a notification, from the particular UE, that the particular UE failed to receive the information,
   wherein the notification from the particular UE includes a request to retransmit the information that the particular UE failed to receive,
   wherein the request from the particular UE corresponds to at least one of:
    a Hybrid Automatic Repeat Request (HARQ) procedure,
    a Forward Error Correction (FEC) procedure, or
    a channel coding procedure;
  determine an appropriate error correction policy, from a plurality of error correction policies, based on whether the network conditions exceed a threshold representing a level of network activity associated with the RAN;
  when the network conditions exceed the threshold, implement a first error correction policy that includes instructions to retransmit information, corresponding to failed transmissions, in accordance with:
   a service requirement associated with each failed transmission, and
   an availability of network resources to retransmit information corresponding to the failed transmissions;
  when the network conditions does not exceed the threshold, implement a second error correction policy that includes instructions to enhance the efficiency with which the information, corresponding to the failed transmissions, is retransmitted by allocating additional network resources to the retransmission of the information corresponding to the failed transmissions, wherein the second error correction policy is selected without regard to the service requirement associated with the failed transmissions; and
  retransmit the information, corresponding to the notification, in accordance with the first error correction policy or the second error correction policy.

2. The base station of claim 1, wherein the network conditions further include a quantity of Physical Resource Blocks (PRBs) allocated to transmitting information from the base station to the UEs.

3. The base station of claim 1, wherein executing the processor-executable instructions further causes the one or more processors to:
 initiate an error correction timer when the network conditions exceed the threshold; and
 implement the first error correction policy so long as the error correction timer has not expired.

4. The base station of claim 1, wherein the network conditions further include signal interference corresponding to wireless transmissions between the UEs and the base station.

5. The base station of claim 1, wherein the network conditions further include an amount of utilization corresponding to a downlink buffer memory of the base station.

6. The base station of claim 1, wherein implementing the first error correction policy consumes less network resources than implementing the second error correction policy.

7. The base station of claim 1, wherein the monitored conditions include:
 the quantity of user equipment (UEs) connected to the base station, and the quantity of connections between the UEs and the base station.

8. A non-transitory computer readable medium storing a plurality of processor-executable instructions, wherein executing the processor-executable instructions causes one or more processors to:
monitor network conditions corresponding to a Radio Access Network (RAN), of a wireless telecommunications network, to which a base station corresponds, wherein the monitored network conditions include at least one of:
a quantity of user equipment (UEs) connected to the base station, or
a quantity of connections between the UEs and the base station;
transmit information to a particular UE connected to the base station;
receive a notification, from the particular UE, that the particular UE failed to receive the information,
wherein the notification from the particular UE includes a request to retransmit the information that the particular UE failed to receive,
wherein the request from the particular UE corresponds to at least one of:
a Hybrid Automatic Repeat Request (HARQ) procedure,
a Forward Error Correction (FEC) procedure, or
a channel coding procedure;
determine an appropriate error correction policy, from a plurality of error correction policies, based on whether the network conditions exceed a threshold representing a level of network activity associated with the RAN;
when the network conditions exceed the threshold, implement a first error correction policy that includes instruction to retransmit information, corresponding to failed transmissions, in accordance with:
a service requirement associated with each failed transmission, and
an availability of network resources to retransmit information corresponding to the failed transmissions;
when the network conditions does not exceed the threshold, implement a second error correction policy that includes instructions to enhance the efficiency with which the information, corresponding to the failed transmissions, is retransmitted by allocating additional network resources to the retransmission of the information corresponding to the failed transmissions, wherein the second error correction policy is selected without regard to the service requirement associated with the failed transmissions; and
retransmit the information, corresponding to the notification, in accordance with the first error correction policy or the second error correction policy.

9. The non-transitory computer readable medium of claim 8, wherein the network conditions further include a quantity of Physical Resource Blocks (PRBs) allocated to transmitting information from the base station to the UEs.

10. The non-transitory computer readable medium of claim 8, wherein the processor-executable instructions further include processor-executable instructions to:
initiate an error correction timer when the network conditions exceed the threshold; and
implement the first error correction policy so long as the error correction timer has not expired.

11. The non-transitory computer-readable medium of claim 8, wherein the network conditions further include signal interference corresponding to wireless transmissions between the UEs and the base station.

12. The non-transitory computer-readable medium of claim 8, wherein the network conditions further include an amount of utilization corresponding to a downlink buffer memory of the base station.

13. The non-transitory computer-readable medium of claim 8, wherein implementing the first error correction policy consumes less network resources than implementing the second error correction policy.

14. The non-transitory computer-readable medium of claim 8, wherein the monitored conditions include:
the quantity of user equipment (UEs) connected to the base station, and
the quantity of connections between the UEs and the base station.

15. A method, comprising:
monitoring, by a base station, network conditions corresponding to a Radio Access Network (RAN), of a wireless telecommunications network, to which the base station corresponds, wherein the monitored network conditions include at least one of:
a quantity of user equipment (UEs) connected to the base station, or
a quantity of connections between the UEs and the base station;
transmitting, by the base station, information to a particular UE connected to the base station;
receiving, by the base station, a notification, from the UE, that the UE failed to receive the information,
wherein the notification from the UE includes a request to retransmit the information that the UE failed to receive,
wherein the request from the UE corresponds to at least one of:
a Hybrid Automatic Repeat Request (HARQ) procedure,
a Forward Error Correction (FEC) procedure, or
a channel coding procedure;
determining, by the base station, an appropriate error correction policy, from a plurality of error correction policies, based on whether the network conditions exceed a threshold representing a level of network activity associated with the RAN;
when the network conditions exceed the threshold, implementing, by the base station, a first error correction policy that includes instruction to retransmit information, corresponding to failed transmissions, in accordance with:
a service requirement associated with each failed transmission, and
an availability of network resources to retransmit information corresponding to the failed transmissions;
when the network conditions does not exceed the threshold, implementing, by the base station, a second error correction policy that includes instructions to enhance the efficiency with which the information, corresponding to the failed transmissions, is retransmitted by allocating additional network resources to the retransmission of the information corresponding to the failed transmissions, wherein the second error correction policy is selected without regard to the service requirement associated with the failed transmissions; and
retransmitting, by the base station, the information, corresponding to the notification, in accordance with the first error correction policy or the second error correction policy.

16. The method of claim 15, wherein the network conditions further include a quantity of Physical Resource Blocks (PRBs) allocated to transmitting information from the base station to the UEs.

17. The method of claim 15, further comprising:
   initiating an error correction timer when the network conditions exceed the threshold; and
   implementing the first error correction policy so long as the error correction timer has not expired.

18. The method of claim 15, wherein the network conditions further include signal interference corresponding to wireless transmissions between the UEs and the base station.

19. The method of claim 15, wherein the network conditions further include an amount of utilization corresponding to a downlink buffer memory of the base station.

20. The method of claim 15, wherein implementing the first error correction policy consumes less network resources than implementing the second error correction policy.

* * * * *